United States Patent
Hsiao

(10) Patent No.: US 10,462,944 B1
(45) Date of Patent: Oct. 29, 2019

(54) WAVE ABSORBING HEAT DISSIPATION STRUCTURE

(71) Applicant: GETAC TECHNOLOGY CORPORATION, Hsinchu County (TW)

(72) Inventor: Wei-Chung Hsiao, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/141,632

(22) Filed: Sep. 25, 2018

(51) Int. Cl.
| H05K 9/00 | (2006.01) |
| H05K 7/20 | (2006.01) |
| H05K 1/02 | (2006.01) |
| H01L 23/373 | (2006.01) |
| F28F 3/00 | (2006.01) |
| H05K 1/18 | (2006.01) |

(52) U.S. Cl.
CPC ............ *H05K 9/0088* (2013.01); *F28F 3/00* (2013.01); *H01L 23/3737* (2013.01); *H05K 1/0203* (2013.01); *H05K 1/0216* (2013.01); *H05K 1/181* (2013.01); *H05K 7/2039* (2013.01); *H05K 7/20481* (2013.01); *H05K 9/0024* (2013.01)

(58) Field of Classification Search
None
See application file for complete search history.

(56) References Cited

U.S. PATENT DOCUMENTS

| 5,221,575 | A | * | 6/1993 | Nakano | H01L 23/373 257/E23.084 |
| 5,606,201 | A | * | 2/1997 | Lutz | F28F 13/02 257/714 |
| 6,309,742 | B1 | * | 10/2001 | Clupper | B32B 5/18 427/247 |
| 6,514,428 | B2 | * | 2/2003 | Suzuki | C08K 3/08 252/62.51 R |
| 6,543,524 | B2 | * | 4/2003 | McCullough | F28F 13/18 165/133 |
| 6,570,086 | B1 | * | 5/2003 | Shimoji | H05K 7/20445 174/377 |
| 6,617,038 | B2 | * | 9/2003 | Sakurai | C08K 5/0091 252/62.51 R |
| 6,683,246 | B2 | * | 1/2004 | Hashimoto | H05K 9/0088 174/394 |

(Continued)

*Primary Examiner* — Robert J Hoffberg

(57) ABSTRACT

A wave absorbing heat dissipation structure adapted to absorb electromagnetic waves of an electronic component and dissipate heat energy of the electronic component. The wave absorbing heat dissipation structure includes a wave absorbing heat dissipation layer and a metal film. The wave absorbing heat dissipation layer is provided at an electronic device, and has a first surface and a second surface opposite to each other, wherein the first surface covers the electronic component. The metal film covers the second surface. The wave absorbing heat dissipation layer is adapted to absorb electromagnetic waves and transmit heat energy. The metal film is adapted to reflect electromagnetic waves and dissipate heat energy. The wave absorbing heat dissipation structure is capable of alleviating interference of electromagnetic waves on an electronic component and enhancing heat dissipation of an electronic component.

10 Claims, 5 Drawing Sheets

(56) References Cited

U.S. PATENT DOCUMENTS

| | | | | |
|---|---|---|---|---|
| 7,253,442 B2* | 8/2007 | Huang | ............... | H01L 23/373 |
| | | | | 257/77 |
| 7,569,425 B2* | 8/2009 | Huang | ............... | H01L 23/373 |
| | | | | 257/77 |
| 7,608,326 B2* | 10/2009 | Johnson | ............. | H01L 23/3733 |
| | | | | 427/58 |
| 7,842,381 B2* | 11/2010 | Johnson | ............. | H01L 23/3733 |
| | | | | 428/323 |
| 9,137,928 B2* | 9/2015 | Chen | ............... | H05K 7/20436 |
| 9,420,734 B2* | 8/2016 | Liu | ............... | H05K 9/0024 |
| 9,746,259 B2* | 8/2017 | Tanaka | ............... | F28F 21/02 |
| 10,306,817 B2* | 5/2019 | Bruzda | ............... | H01L 23/552 |
| 2003/0161132 A1* | 8/2003 | Shimoji | ............... | H01L 23/433 |
| | | | | 361/800 |
| 2004/0214496 A1* | 10/2004 | Yang | ............... | H05K 9/0086 |
| | | | | 442/301 |
| 2010/0301261 A1* | 12/2010 | Chiang | ............... | C09K 5/14 |
| | | | | 252/75 |
| 2012/0080171 A1* | 4/2012 | Uesugi | ............... | F28D 10/0233 |
| | | | | 165/104.26 |
| 2013/0202848 A1* | 8/2013 | Kim | ............... | H01B 7/421 |
| | | | | 428/141 |
| 2013/0240261 A1* | 9/2013 | Song | ............... | H05K 9/0075 |
| | | | | 174/391 |
| 2014/0097014 A1* | 4/2014 | Choi | ............... | H05K 9/0015 |
| | | | | 174/356 |
| 2016/0233173 A1* | 8/2016 | Do | ............... | C09K 5/14 |
| 2016/0338232 A1* | 11/2016 | Liu | ............... | H05K 9/0024 |
| 2018/0295756 A1* | 10/2018 | Hirose | ............... | H05K 9/0081 |
| 2019/0080978 A1* | 3/2019 | Kumura | ............... | H01L 23/36 |

* cited by examiner

WAVE ABSORBING HEAT DISSIPATION STRUCTURE

BACKGROUND OF THE INVENTION

Field of the Invention

The present invention relates to a wave absorbing heat dissipation structure.

Description of the Prior Art

An electronic system includes many electronic components, which generate electromagnetic waves during operations, wherein the electromagnetic waves generated by any one of these electronic components may interfere operations thereof and of other electronic components. Thus, in the prior art, a wave absorbing plate is used to cover an electromagnetic wave sensitive electronic component to reduce electromagnetic interference (noise), so as to maintain normal operations of the electromagnetic wave sensitive electronic component. The source of electromagnetic interference is, for example, electromagnetic waves of another electronic component or reflected electromagnetic waves of an electromagnetic wave sensitive electronic component. In general, the wave absorbing effect improves as the thickness of a wave absorbing plate increases, and electromagnetic wave interference can thus be alleviated. However, a thicker wave absorbing plate disfavors heat dissipation of an electronic device, and contrarily exposes an electronic device to high risks of being overheated.

The section "description of the prior art" is used for assisting in understanding of the contents of the present invention, and thus the disclosure in the "description of the prior art" may include details that do not constitute certain prior art generally known to a person skilled in the art. Further, the disclosure of the "description of the prior art" neither represents the problems to be solved by the disclosure or one or more embodiments of the present invention, nor means that the art of the present invention is already known to or recognized by a person skilled in the art before the application of the present invention.

SUMMARY OF THE INVENTION

The present invention provides a wave absorbing heat dissipation structure capable of alleviating interference of electromagnetic waves on an electronic component and enhancing heat dissipation of an electronic component.

A wave absorbing heat dissipation structure provided by the present invention is adapted to absorb electromagnetic waves of an electronic device and dissipate heat energy of an electronic device. The wave absorbing heat dissipation structure includes a wave absorbing heat dissipation layer and a metal film. The wave absorbing heat dissipation layer is arranged on an electronic device, and has a first surface and a second surface opposite to each other, wherein the first surface covers the electronic device. The metal film covers the second surface. The wave absorbing heat dissipation layer is adapted to absorb electromagnetic waves and transmit heat energy. The metal film is adapted to reflect electromagnetic waves and dissipate heat energy.

In the wave absorbing heat dissipation structure of the present invention, through the wave absorbing heat dissipation layer having the first surface adapted for covering the electronic component and the metal film layer covering the second surface of the wave absorbing heat dissipation layer, the wave absorbing heat dissipation structure provides advantages of both alleviating electromagnetic interference on a first electronic device and enhancing heat dissipation of the first electronic device, thereby maintaining normal operations of the first electronic device.

To better understand the above and other objects, features and advantages of the present invention, embodiments are described in detail with the accompanying drawings below.

DETAILED DESCRIPTION OF THE EMBODIMENTS

Figure 1:
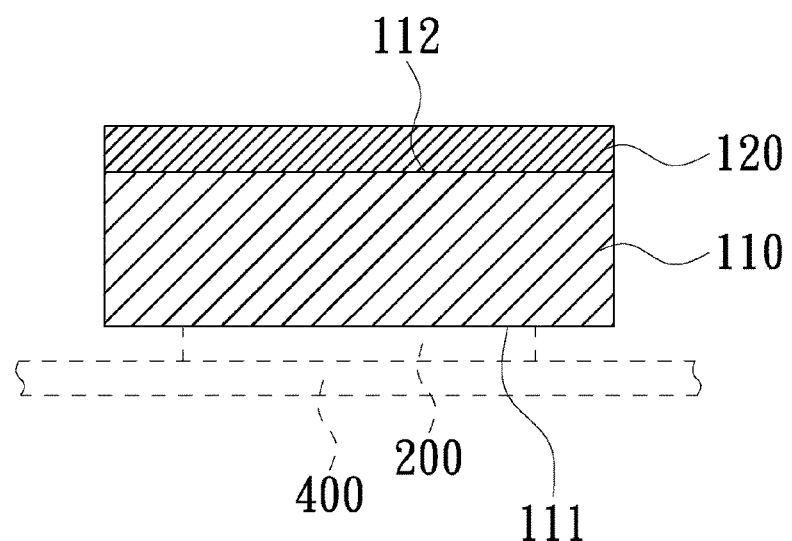
FIG. 1 is a section schematic diagram of a wave absorbing heat dissipation structure according to a first embodiment of the present invention.
Figure 2:
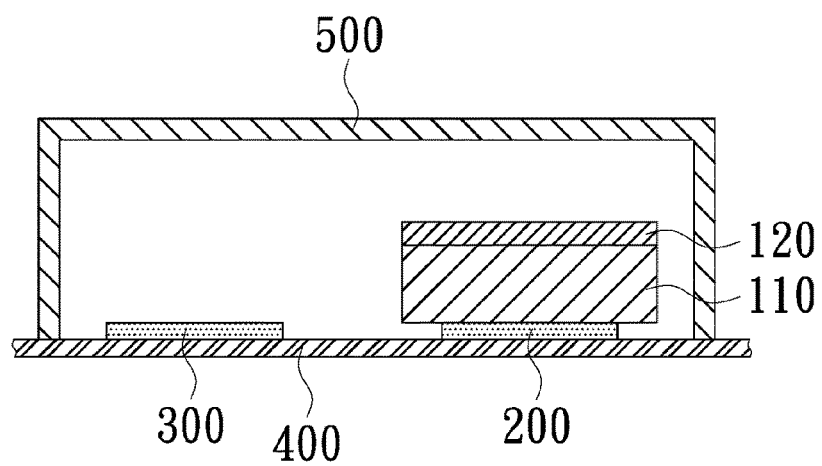
FIG. 2 is a schematic diagram of a wave absorbing heat dissipation structure in use according to the first embodiment of the present invention.

FIG. 1 shows a section schematic diagram of a wave absorbing heat dissipation structure according to a first embodiment of the present invention. FIG. 2 shows a schematic diagram of a wave absorbing heat dissipation structure in use according to the first embodiment of the present invention. Referring to FIG. 1 and FIG. 2, a wave absorbing heat dissipation structure 100 of this embodiment is adapted to absorb electromagnetic waves of a first electronic component 200 and dissipate heat energy of the first electronic component 200. The wave absorbing heat dissipation structure 100 includes a wave absorbing heat dissipation layer 110 and a metal film 120. The wave absorbing heat dissipation layer 110 has a first surface 111 and a second surface 112 opposite to each other, wherein the first surface 111 covers the first electronic component 200, and the metal film 120 covers the second surface 112. The wave absorbing heat dissipation layer 110 is adapted to absorb electromagnetic waves of the first electronic component 200 and transmit heat energy of the first electronic component 200. The metal film 120 is adapted to reflect electromagnetic waves of the first electronic component 200 and dissipate heat energy of the first electronic component 200. Further, the wave absorbing heat dissipation layer 110 may be made of, for example but not limited to, a mixture of electromagnetic absorbing particles and/or heat dissipating particles with a high polymer material. The high polymer material may be, for example, silicone rubber. Further, the material of the metal film 120 may be, for example but not limited to, a metal or an alloy, e.g., metal such as aluminum, copper and silver or an alloy of the above.

The wave absorbing heat dissipation structure 100 may be arranged on the first electronic component 200, and the first electronic component 200 and a second electronic component 300 may be arranged on a circuit board 400. Further, a heat dissipation module 500 may cover the first electronic component 200, the second electronic component 300 and the wave absorbing heat dissipation structure 100. Compared to the second electronic component 300, the first electronic component 200 is more sensitive to electromagnetic waves; that is, the first electronic component 200 is more susceptible to interference of other electromagnetic waves (i.e., noise) and thus has difficulties in maintaining normal operations thereof. For example, such other electromagnetic waves are electromagnetic waves emitted by the second electronic component 300 or reflected electromagnetic waves of the first electronic component 200 (i.e., electromagnetic waves emitted by the first electronic component 200 and reflected back to the first electronic component 200). Further, for example but not limited to, the first electronic component 200 is a satellite positioning chip, the second electronic component 300 is a solid-state disk, and the first electronic device 200, the second electronic device 300 and the circuit board 400 are internal components of a portable electronic device.

In this embodiment, a part of the electromagnetic waves emitted by the first electronic component 200 may be directly absorbed by the wave absorbing heat dissipation layer 110; another part of the electromagnetic waves emitted by the first electronic component 200 pass through the wave absorbing heat dissipation layer 110, reflected by the metal film 120 towards the wave absorbing heat dissipation layer 110, and are eventually absorbed by the wave absorbing heat dissipation layer 110; yet another part of the electromagnetic waves emitted by the first electronic component 200 pass through the wave absorbing heat dissipation layer 110 and the metal film 120, and are reflected by the heat dissipation module 500 and then further reflected by the metal film 120 towards the heat dissipation module 500 without producing interference on the first electronic component 200; yet another part of the electromagnetic waves emitted by the first electronic component 200 pass through the wave absorbing heat dissipation layer 110, the metal layer 120 and the heat dissipation module 500, and are sent outwards. Accordingly, the interference caused by the electromagnetic waves emitted by the first electronic component 200 on the first electronic component 200 itself and the second electronic component 300 can be reduced. The electromagnetic waves emitted by the second electronic component 300 can be reflected by the metal film 120 or be absorbed by the heat absorbing heat dissipation layer 110. Accordingly, the interference of the electromagnetic waves emitted by the second electronic component 300 on the first electronic component 200 can be reduced. Further, heat energy generated by the first electronic component 200 can be transmitted to the metal film 120 through the heat dissipation layer 110 and be dissipated through the metal film 120, and may eventually be dissipated together with the heat energy generated by the second electronic component 300 through the heat dissipation module 500. Therefore, in addition to alleviating the interference of electromagnetic waves on the first electronic component 200, the wave absorbing heat dissipation structure 100 of the embodiment further helps heat dissipation of the first electronic component 200, thereby benefiting the normal operation of the first electronic component 200.

Figure 3:
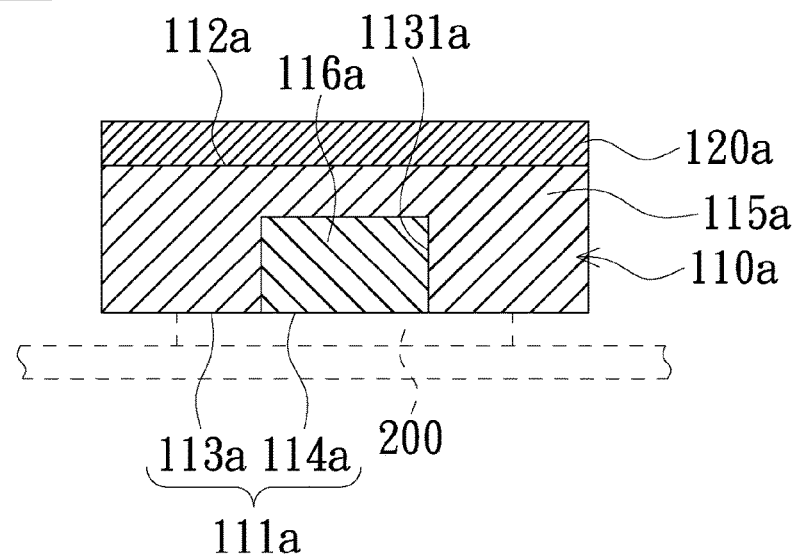
FIG. 3 is a section schematic diagram of a wave absorbing heat dissipation structure according to a second embodiment of the present invention.
Figure 4:
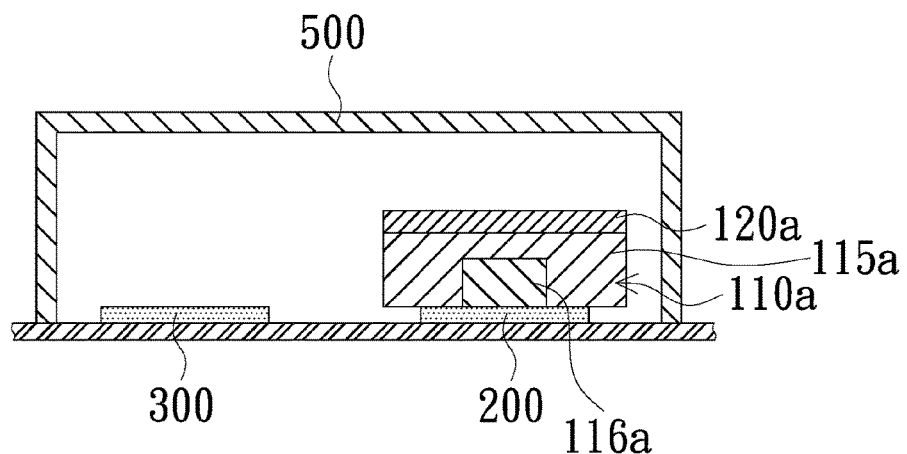
FIG. 4 is a schematic diagram of a wave absorbing heat dissipation structure in use according to the second embodiment of the present invention.

FIG. 3 shows a section schematic diagram of a wave absorbing heat dissipation structure according to a second embodiment of the present invention. FIG. 4 shows a schematic diagram of a wave absorbing heat dissipation structure in use according to the second embodiment of the present invention. Referring to FIG. 3 and FIG. 4, a wave absorbing heat dissipation structure 100*a* of this embodiment differs from the wave absorbing heat dissipation structure 100 of the first embodiment in that: in this embodiment, a first surface 111*a* of the wave absorbing heat dissipation layer 110*a* further includes a third surface 113*a* and a fourth surface 114*a* that are adjacent, wherein the third surface 113*a* and the fourth surface 114*a* cover the first electronic component 200; the wave absorbing heat dissipation layer 110*a* further includes a wave absorbing portion 115*a* and a heat dissipation portion 116*a*, wherein the wave absorbing portion 115*a* has a second surface 112*a* and the third surface 113*a* of the first surface 111*a*; a groove 1131*a* extending towards the second surface 112*a* is formed on the third surface 113*a*, and the heat dissipation portion 116*a* is arranged in the groove 1131*a* and has the fourth surface 114*a*. Further, the third surface 113*a* may be adjacent to a periphery of the fourth surface 114*a*. In this embodiment, the wave absorbing heat dissipation layer 110*a* may consist of the heat dissipation portion 116*a* and a wave absorbing portion 115*a* surrounding the heat dissipation portion 116*a*. The material of the heat dissipation portion 116*a* may be different from that of the wave absorbing portion 115*a*. Further, the shape of the groove 1131*a* may be, for example but not limited to, a geometric shape such as a circle, a rectangle, a trapezoid or a triangle. The shape of the groove 1131*a* may also be an irregular shape. The shape of the heat dissipation portion 116*a* may corresponding to that of the groove 1131*a*, or may not correspond to that of the groove 1131*a*.

In this embodiment, a part of the electromagnetic waves emitted by the first electronic component 200 may directly be absorbed by the wave absorbing portion 115*a*, another part of the electromagnetic waves emitted by the first electronic component 200 pass through the heat dissipation portion 116*a* and the wave absorbing portion 115*a* or the wave absorbing portion 115*a*, and are absorbed and the reflected by a metal film 120*a* towards the wave absorbing heat dissipation layer 110*a* and eventually absorbed by the absorbing portion 115*a*, another part of the electromagnetic waves emitted by the first electronic component 200 pass through the wave absorbing heat dissipation layer 110*a* and the metal layer 120*a*, and are reflected by the heat dissipation module 500 and further reflected by the metal film 120*a* towards the heat dissipation module 500 without producing any interference on the first electronic component 200; yet another part of the electromagnetic waves emitted by the first electronic component 200 pass through the wave absorbing heat dissipation layer 110*a*, the metal film 120*a* and the heat dissipation module 500, and are sent outwards. Accordingly, the interference of the electromagnetic waves emitted by the first electronic component 200 on the first electronic component 200 itself and the second electronic component 300 can be reduced. Further, the electromagnetic waves emitted by the second electronic component 300 may be reflected by the metal film 120*a* or be absorbed by the wave absorbing portion 115*a*, accordingly reducing the interference of the electromagnetic waves emitted by the second electronic component 300 on the first electronic component 200. Further, heat energy generated by the first electronic component 200 passes through the heat dissipation portion 116*a* and the wave absorbing portion 115*a*, and is transmitted to the metal film 120*a*, dissipated through the metal film 120*a* and eventually dissipated together with heat energy generated by the second electronic component 300 through the heat dissipation module 500. Thus, in addition to alleviating interference of electromagnetic waves on the first electronic component 200, the wave absorbing heat dissipation structure 100 of this embodiment further helps heat dissipation of the first electronic component 200, thereby benefiting the normal operation of the first electronic component 200.

Figure 5:
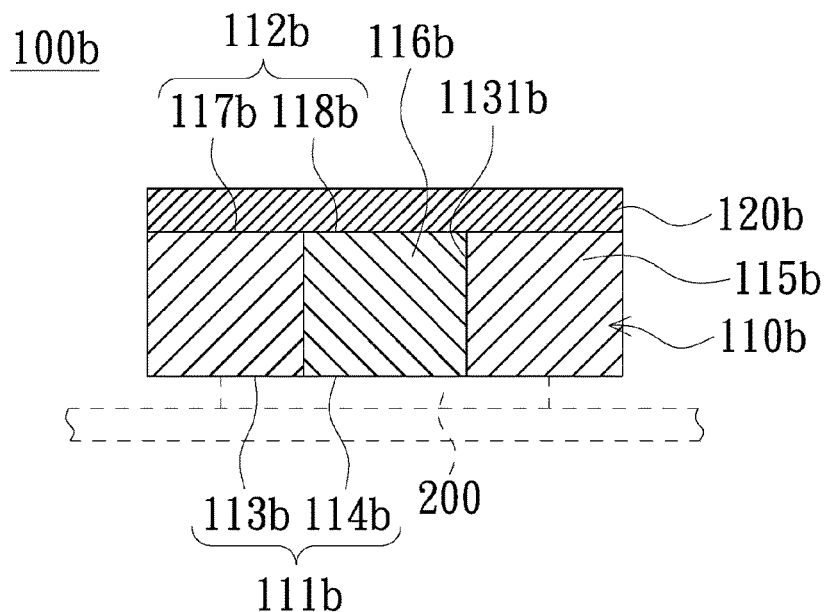
FIG. 5 is a section schematic diagram of a wave absorbing heat dissipation structure according to a third embodiment of the present invention.
Figure 6:
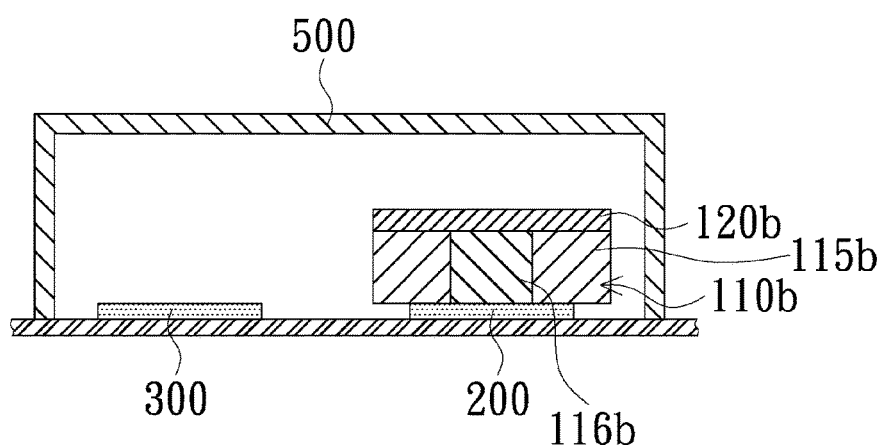
FIG. 6 is a schematic diagram of a wave absorbing heat dissipation structure in use according to the third embodiment of the present invention.

FIG. 5 shows a section schematic diagram of a wave absorbing heat dissipation structure according to a third embodiment of the present invention. FIG. 6 shows a schematic diagram of a wave absorbing heat dissipation structure in use according to the third embodiment of the present invention. Referring to FIG. 5 and FIG. 6, a wave absorbing heat dissipation structure 100*b* of this embodiment differs from the wave absorbing heat dissipation 100 of the first embodiment in that: in this embodiment, a first surface 111*b* of a wave absorbing heat dissipation layer 110*b* further includes a third surface 113*b* and a fourth surface 114*b* that are adjacent, wherein the third surface 113*b* and the fourth surface 114*b* cover the first electronic component 200; a second surface 112*b* further includes a fifth surface 117*b* and a sixth surface 118*b* that are adjacent, wherein a metal film 120*b* covers the fifth surface 117*b* and the sixth surface 118*b*; a wave absorbing heat dissipation layer 110*b* further includes a wave absorbing portion 115*b* and a heat dissipation portion 116*b*, wherein the wave absorbing portion 115*b* has the third surface 113*b* and the fifth surface 117*b*; a through hole 1131*b* is formed between the third surface 113*b* and the fifth surface 117*b*, and the heat dissipation portion 116*b* is arranged in the through hole 1131*b* and has the fourth surface 114*b* and the sixth surface 118*b*. Further, the third surface 113*b* may be adjacent to a periphery of the fourth surface 114*b*, and the fifth surface 117*b* may be adjacent to a periphery of the sixth surface 118*b*. Further, the shape of the through hole 1131*b* may be, for example but not limited to, a geometric shape such as a circle, a rectangle, a trapezoid, or a triangle. The shape of the through hole 1311*b* may also be an irregular shape. The shape of the heat dissipation portion 116*b* may correspond to that of the through hole 1131*b*, or may not correspond to that of the through hole 1131*b*.

In this embodiment, a part of the electromagnetic waves emitted by the first electronic component 200 may be directly absorbed by the absorbing portion 115*b*, another part of the electromagnetic waves emitted by the first electronic component 200 pass through the heat dissipation portion 116*b* or the wave absorbing portion 115*b*, and are reflected by a metal film 120*b* towards the wave absorbing heat dissipation layer 110*b* and eventually absorbed by the wave absorbing portion 115*b*, yet another part of the electromagnetic waves emitted by the first electronic component 200 pass through the wave absorbing heat dissipation layer 110*b* and the metal film 120*b*, and are reflected by the heat dissipation module 500 and further reflected by the metal film 120*b* towards the heat dissipation module 500 without producing interference on the first electronic component 200; yet another part of the electromagnetic waves emitted by the first electronic component 200 pass through the wave absorbing layer 110*b*, the metal film 120*b* and the heat dissipation module 500, and are sent outwards. Accordingly, the interference of the electromagnetic waves emitted by the first electronic component 200 on the first electronic component 200 itself and the second electronic component 300 can be reduced. Further, the electromagnetic waves emitted by the second electronic component 300 may be reflected by the metal film 120*b* or be absorbed by the wave absorbing portion 115*b*, accordingly reducing the interference of the electromagnetic waves emitted by the second electronic component 300 on the first electronic component 200. Further, heat energy generated by the first electronic component 200 is transmitted to the metal film 120*a* through the heat dissipation portion 116*b* of the wave absorbing heat dissipation layer 110*b*, and dissipated through the metal film 120*a* and eventually dissipated together with heat energy generated by the second electronic component 300 through the heat dissipation module 500. Thus, in addition to alleviating interference of electromagnetic waves on the first electronic component 200, the wave absorbing heat dissipation structure 100 of this embodiment further helps heat dissipation of the first electronic component 200, thereby benefiting the normal operation of the first electronic component 200.

Figure 7:
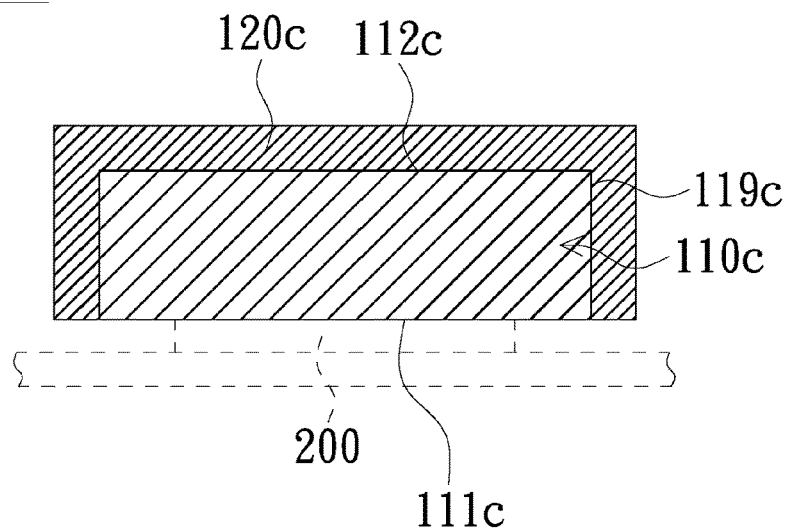
FIG. 7 is a section schematic diagram of a wave absorbing heat dissipation structure according to a fourth embodiment of the present invention.

FIG. 7 shows a section schematic diagram of a wave absorbing heat dissipation structure according to a fourth embodiment of the present invention. Referring to FIG. 7, a wave absorbing heat dissipation structure 100*c* of this embodiment differs from the wave absorbing heat dissipation structure 100 of the first embodiment in that: in this embodiment, a wave absorbing heat dissipation layer 110*c* further has an outer surface 119*c* that is connected to a first surface 111*c* and a second surface 112*c*, and a metal film 120*c* simultaneously covers the outer surface 119*c* and the second surface 112*c*. Accordingly, the electromagnetic waves at the outer surface 119*c* can be reflected by a metal film 120*c*, absorbed by the wave absorbing heat dissipation layer 110*c*, or reflected by the metal film 120*c* and absorbed by the wave absorbing heat dissipation layer 110*c*. Therefore, compared to the wave absorbing heat dissipation structure 100 of the first embodiment, the wave absorbing heat dissipation structure 100*c* of this embodiment further alleviates the interference of electromagnetic waves on the first electronic component 200, thereby ensuring the normal operation of the first electronic component 200.

Figure 8:
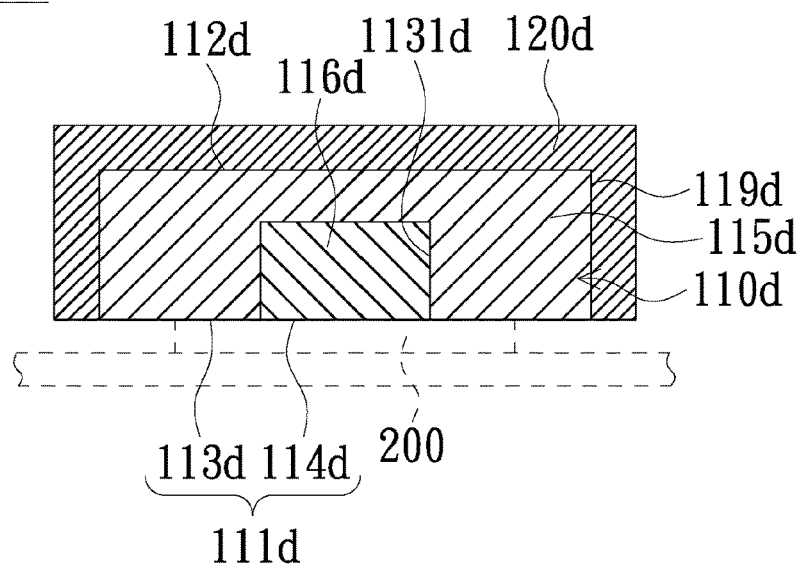
FIG. 8 is a section schematic diagram of a wave absorbing heat dissipation structure according to a fifth embodiment of the present invention.

FIG. 8 shows a section schematic diagram of a wave absorbing heat dissipation structure according to a fourth embodiment of the present invention. Referring to FIG. 8, a wave absorbing heat dissipation structure 100*d* of this embodiment differs from the wave absorbing heat dissipation structure 110*c* of the fourth embodiment in that: in this embodiment, a first surface 111*d* of a wave absorbing heat dissipation layer 110*d* further includes a third surface 113*d* and a fourth surface 114*d* that are adjacent, wherein the third surface 113*d* and the fourth surface 114*d* cover the first electronic component 200, and an outer surface 119*d* is connected to the third surface 113*d* and the second surface 112*d*; the wave absorbing heat dissipation layer 110*d* further includes a wave absorbing portion 115*d* and a heat dissipation portion 116*d*, wherein the wave absorbing portion 115*d* has the second surface 112*d*, the third surface 113*d* of the first surface 111*d* and the outer surface 119*d*, a groove 1131*d* extending towards the second surface 112*d* is formed on the third surface 113*d*, and the heat dissipation portion 116*d* is arranged in the groove 1131*d* and has the fourth surface 114*d*. Further, the third surface 113*d* may be adjacent to a periphery of the fourth surface 114*d*. The wave absorbing heat dissipation structure 110*d* of this embodiment provides the same advantages as the wave absorbing heat dissipation structure 100*a* of the second embodiment. However, in this embodiment, the electromagnetic waves at the outer surface 119d may be reflected by a metal film 120d, absorbed by the wave absorbing heat dissipation layer 110d, or be reflected by the metal film 120d and absorbed by the wave absorbing heat dissipation layer 110d. Therefore, compared to the wave absorbing heat dissipation structure 100a of the second embodiment, the wave absorbing heat dissipation structure 100d of this embodiment further alleviates the interference of electromagnetic waves on the first electronic component 200, thereby ensuring the normal operation of the first electronic component 200.

Figure 9:
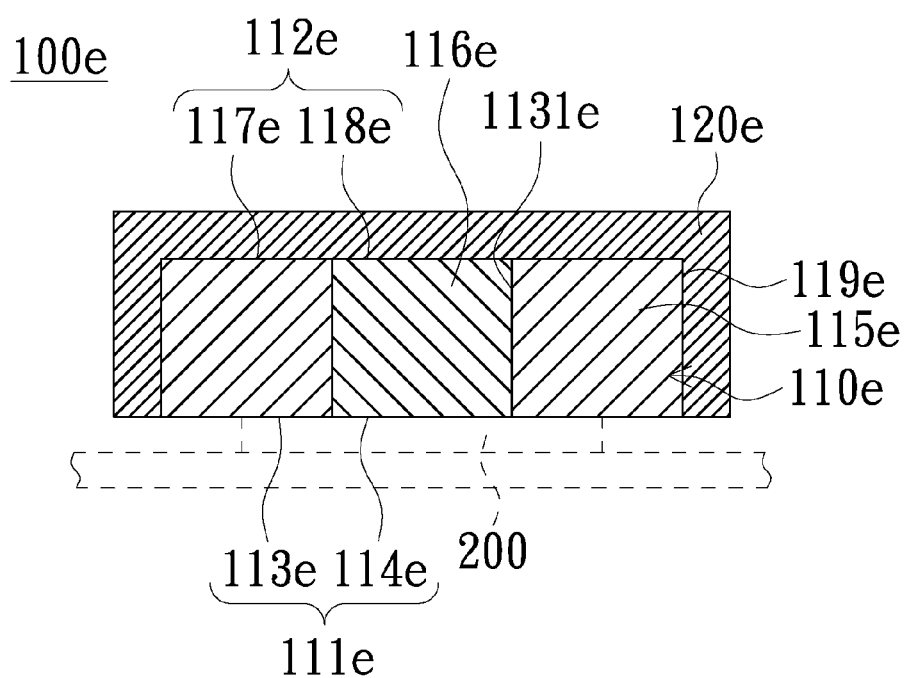
FIG. 9 is a section schematic diagram of a wave absorbing heat dissipation structure according to a sixth embodiment of the present invention.

FIG. 9 shows a section schematic diagram of a wave absorbing heat dissipation structure according to a sixth embodiment of the present invention. Referring to FIG. 9, a wave absorbing heat dissipation structure 100e of this embodiment differs from the wave absorbing heat dissipation structure 100c of the fourth embodiment in that: in this embodiment, a first surface 111e of a wave absorbing heat dissipation layer 110e further includes a third surface 113e and a fourth surface 114e that are adjacent, wherein the third surface 113e and the fourth surface 114e cover the first electronic component 200; a second surface 112e further includes a fifth surface 117e and an eighth surface 118e that are adjacent, wherein an outer surface 119e connects the third surface 113e and the fifth surface 117e, a metal film 120e covers the fifth surface 117e, the sixth surface 118e and the outer surface 119e, the wave absorbing heat dissipation layer 110e further includes a wave absorbing portion 115e and a heat dissipation portion 116e, wherein the wave absorbing portion 115e has the third surface 113e, the fifth surface 117e and the outer surface 119e; a through hole 1131e is formed between the third surface 113e and the fifth surface 117e, and the heat dissipation portion 116e is arranged in the through hole 1131e and has the fourth surface 114e and the sixth surface 118e. Further, the third surface 113e may be adjacent to a periphery of the fourth surface 114e, and the fifth surface 117e may be adjacent to a periphery of the sixth surface 118e. The wave absorbing heat dissipation structure 110e of this embodiment provides the same advantages as the wave absorbing heat dissipation structure 100b of the third embodiment. However, in this embodiment, the electromagnetic waves at the outer surface 119e may be reflected by a metal film 120e, be absorbed by the wave absorbing heat dissipation layer 110e, or be reflected by the metal film 120e and absorbed by the wave absorbing heat dissipation layer 110e, or be reflected by the metal film 120e and/or absorbed by the wave absorbing heat dissipation layer 110e. Therefore, compared to the wave absorbing heat dissipation 100b of the third embodiment, the wave absorbing heat dissipation 100e of this embodiment further alleviates the interference of electromagnetic waves on the first electronic component 200, thereby ensuring the normal operation of the first electronic component 200.

In conclusion, the wave absorbing heat dissipation structure of the present invention, through the wave absorbing heat dissipation layer having the first surface adapted for covering the electronic component and the metal film layer covering the second surface of the wave absorbing heat dissipation layer, the wave absorbing heat dissipation structure provides advantages of both alleviating electromagnetic interference on the first electronic device and enhancing heat dissipation of the first electronic device, thereby maintaining normal operations of the first electronic device.

While the invention has been described by way of example and in terms of the preferred embodiments, it is to be understood that the invention is not limited thereto. Various modifications and similar arrangements and procedures made by a person skilled in the art without departing from the spirit of the present invention are encompassed within the scope of the present invention, and the scope of the present invention therefore should be accorded with the broadest interpretation of the appended claims. Further, the terms "first" and "second" throughout the application or claims are only for naming components or distinguishing different embodiments and scopes, and are not to be construed as limiting an upper limit or a lower limit of quantities of the components.

What is claimed is:

1. A wave absorbing heat dissipation structure, adapted to absorb electromagnetic waves of an electronic component and dissipating heat energy of the electronic component, the wave absorbing heat dissipation structure comprising:
    a wave absorbing heat dissipation layer, adapted to be arranged on the electronic component, having a first surface and a second surface with positions opposite to each other, the first surface covering the electronic device, wherein the wave absorbing heat dissipation layer further comprises a wave absorbing portion and a heat dissipation portion; and
    a metal film, covering the second surface;
    wherein, the wave absorbing heat dissipation layer is adapted to absorb the electromagnetic waves and transmit the heat energy, and the metal film is adapted to reflect the electromagnetic waves and dissipate the heat energy;
    wherein the first surface further comprises a third surface and a fourth surface that are adjacent, the third surface and the fourth surface adapted to cover the electronic component, the second surface further comprises a fifth surface and a sixth surface, the metal film covers the fifth surface and the sixth surface, the wave absorbing portion has the third surface of the first surface and the fifth surface of the second surface, a through hole is formed between the third surface and the fifth surface, and the heat dissipation portion is arranged in the through hole and has the fourth surface and the sixth surface; and
    wherein the wave absorbing portion is a polymer material comprising electromagnetic absorbing particles, the heat dissipation portion is a polymer material comprising heat dissipating particles, and compositions of the wave absorbing portion and the heat dissipation portion are different.

2. The wave absorbing heat dissipation structure according to claim 1, wherein the wave absorbing heat dissipation layer further comprises an outer surface, the outer surface connects the first surface and the second surface, and the metal film further covers the outer surface.

3. The wave absorbing heat dissipation structure according to claim 1, wherein the third surface is adjacent to a periphery of the fourth surface, and the fifth surface is adjacent to a periphery of the sixth surface.

4. The wave absorbing heat dissipation structure according to claim 1, wherein the wave absorbing portion has an outer surface, the outer surface connects the third surface and the fifth surface, and the metal film further covers the outer surface.

5. The wave absorbing heat dissipation structure according to claim 4, wherein the third surface is adjacent to a periphery of the fourth surface, and the fifth surface is adjacent to a periphery of the sixth surface.

6. An apparatus, comprising:
    an electronic component comprising a central portion and a peripheral portion; and a wave absorbing heat dissipation structure, adapted to absorb electromagnetic waves of the electronic component and dissipating heat energy of the electronic component, the wave absorbing heat dissipation structure comprising:
  a wave absorbing heat dissipation layer, arranged on the electronic component, having a first surface and a second surface with positions opposite to each other, the first surface covering the electronic device, wherein the wave absorbing heat dissipation layer further comprises a wave absorbing portion and a heat dissipation portion, and wherein the heat dissipation portion is adjacent to the central portion and the wave absorbing portion is adjacent to the peripheral portion; and
  a metal film, covering the second surface;
wherein, the wave absorbing heat dissipation layer is adapted to absorb the electromagnetic waves and transmit the heat energy, and the metal film is adapted to reflect the electromagnetic waves and dissipate the heat energy;
wherein the wave absorbing portion is a polymer material comprising electromagnetic absorbing particles, the heat dissipation portion is a polymer material comprising heat dissipating particles, and compositions of the wave absorbing portion and the heat dissipation portion are different; and
wherein the first surface further comprises a third surface and a fourth surface that are adjacent, the third surface and the fourth surface cover the electronic component, the second surface further comprises a fifth surface and a sixth surface, the metal film covers the fifth surface and the sixth surface, the wave absorbing portion has the third surface of the first surface and the fifth surface of the second surface, a through hole is formed between the third surface and the fifth surface, and the heat dissipation portion is arranged in the through hole and has the fourth surface and the sixth surface.

7. The apparatus according to claim 6, wherein the wave absorbing heat dissipation layer further comprises an outer surface, the outer surface connects the first surface and the second surface, and the metal film further covers the outer surface.

8. The apparatus according to claim 6, wherein the third surface is adjacent to a periphery of the fourth surface, and the fifth surface is adjacent to a periphery of the sixth surface.

9. The apparatus according to claim 6, wherein the wave absorbing portion has an outer surface, the outer surface connects the third surface and the fifth surface, and the metal film further covers the outer surface.

10. The apparatus according to claim 9, wherein the third surface is adjacent to a periphery of the fourth surface, and the fifth surface is adjacent to a periphery of the sixth surface.

\* \* \* \* \*